(12) United States Patent
Huetter et al.

(10) Patent No.: US 9,774,351 B2
(45) Date of Patent: Sep. 26, 2017

(54) METHOD AND APPARATUS FOR ENCODING INFORMATION UNITS IN CODE WORD SEQUENCES AVOIDING REVERSE COMPLEMENTARITY

(71) Applicant: THOMSON LICENSING, Issy les Moulineaux (FR)

(72) Inventors: Ingo Huetter, Pattensen (DE); Meinolf Blawat, Hannover (DE); Klaus Gaedke, Hannover (DE); Xiao-Ming Chen, Hannover (DE)

(73) Assignee: THOMSON LICENSING, Issy les Moulineaux (FR)

(*) Notice: Subject to any disclaimer, the term of this patent is extended or adjusted under 35 U.S.C. 154(b) by 0 days.

(21) Appl. No.: 15/317,914

(22) PCT Filed: Jun. 9, 2015

(86) PCT No.: PCT/EP2015/062760
§ 371 (c)(1),
(2) Date: Dec. 9, 2016

(87) PCT Pub. No.: WO2015/193140
PCT Pub. Date: Dec. 23, 2015

(65) Prior Publication Data
US 2017/0134045 A1 May 11, 2017

(30) Foreign Application Priority Data
Jun. 17, 2014 (EP) .................................. 14305922

(51) Int. Cl.
*H03M 7/38* (2006.01)
*H03M 7/46* (2006.01)
(52) U.S. Cl.
CPC .................... *H03M 7/46* (2013.01)

(58) Field of Classification Search
CPC ....................................................... H03M 7/46
(Continued)

(56) References Cited

U.S. PATENT DOCUMENTS

| 5,872,522 A * | 2/1999 | Gibson | H04W 84/025 340/10.2 |
| 5,881,092 A * | 3/1999 | Gibson | H04W 84/025 370/312 |

(Continued)

FOREIGN PATENT DOCUMENTS

| EP | 542845 | 5/1996 |
| WO | WO2013178801 | 12/2012 |

OTHER PUBLICATIONS

Church et al., "Next-Generation Digital Information Storage in DNA", Science, vol. 337, Sep. 28, 2012, pp. 1628.

(Continued)

*Primary Examiner* — Lam T Mai
(74) *Attorney, Agent, or Firm* — Brian J. Dorini; Patricia A. Verlangieri

(57) ABSTRACT

A method (100) and an apparatus (200) for encoding information in codeword sequences are described which help avoid synthesizing reverse complementary nucleotide sequences, making them suitable for synthesizing nucleic acid strands. Multiple codes are provided (102), consisting of a same amount of corresponding code words. No word belongs to more than one code. Each code could completely encode all information units which are encoded using code word sequences generated from the codes. Generating (105) a sequence comprises: selecting (106), from code words of a code, a next code word to be appended to the sequence; appending (108) the next code word if a concatenation of the sequence and the next code word does not contain a reverse complementary of any code symbol sequence that at least partly contains the next code word; and otherwise (109)

(Continued)

selecting a corresponding next code word from a different code and repeating the appending.

15 Claims, 3 Drawing Sheets

(58) Field of Classification Search
USPC .................................................. 341/50–70
See application file for complete search history.

(56) References Cited

U.S. PATENT DOCUMENTS

| | | | | |
|---|---|---|---|---|
| 5,892,793 | A * | 4/1999 | Gibson | H04B 1/707 375/150 |
| 5,925,144 | A * | 7/1999 | Sebaa | G01R 31/31813 714/30 |
| 6,094,146 | A * | 7/2000 | Sharpe | H04W 88/187 340/3.5 |
| 6,097,751 | A * | 8/2000 | Relph | H04J 13/0022 370/312 |
| 6,388,587 | B1 * | 5/2002 | Brickner | G11B 20/10009 341/59 |
| 7,310,598 | B1 * | 12/2007 | Mikhael | G10L 19/038 704/203 |
| 2005/0117508 | A1 * | 6/2005 | Gaal | H04J 13/10 370/209 |
| 2007/0188781 | A1 * | 8/2007 | Uzawa | G06K 1/121 358/1.9 |
| 2017/0109229 | A1 * | 4/2017 | Huetter | G06F 11/1004 |

OTHER PUBLICATIONS

Garzon et al., "In Search of Optimal Codes for DNA Computing", 12th International Meeting on DNA Computing, Seoul, Korea, Jun. 5, 2006, pp. 143-156.

Phan et al., "The Capacity of DNA for Information Encoding", 10th international Workshop on DNA Computing, Milan, Italy, Jun. 7, 2005, pp. 281-292.

Maiti et al., "Solution Structure and Conformational Dynamics of Deoxyxylonucleic Acids (dXNA): An Orthogonal Nucleic Acid Candidate", Chemistry—A European Journal, vol. 18, No. 3, 2013, pp. 869-879.

Goldman et al., "Towards practical, high-capacity, low-maintenance, information storage in synthesized DNA", Nature, vol. 494, Feb. 7, 2013, pp. 77-80.

* cited by examiner

METHOD AND APPARATUS FOR ENCODING INFORMATION UNITS IN CODE WORD SEQUENCES AVOIDING REVERSE COMPLEMENTARITY

This application claims the benefit, under 35 U.S.C. §365 of International Application PCT/EP2015/062760, filed Jun. 9, 2015, which was published in accordance with PCT Article 21(2) on Dec. 23, 2015, in English, and which claims the benefit of European Application No. 14305922.8 filed Jun. 17, 2014. The European and PCT applications are expressly incorporated by reference herein in their entirety for all purposes.

FIELD

A method and an apparatus for encoding information suitably for nucleic acid storage are presented. In particular, the present disclosure relates to a method and an apparatus for encoding information units in code word sequences avoiding reverse complementarity, and to a computer readable storage medium.

BACKGROUND

A nucleic acid is a polymeric macromolecule and consists of a sequence of monomers known as nucleotides. Each nucleotide consists of a sugar component, a phosphate group and a nitrogenous base or nucleobase. Nucleic acid molecules where the sugar component of the nucleotides is deoxyribose are DNA (deoxyribonucleic acid) molecules, whereas nucleic acid molecules where the sugar component of the nucleotides is ribose are referred to as RNA (ribonucleic acid) molecules. DNA and RNA are biopolymers appearing in living organisms.

Nucleic acid molecules are assembled as chains or strands of nucleotides. Nucleic acid molecules can be generated artificially and their chain structure can be used for encoding any kind of user data. For storing data in synthesized, i.e. artificially created, DNA or RNA, usually short DNA or RNA fragments (oligonucleotides, short: oligos) are generated. With these nucleic acid fragments, a data storage system can be realized wherein data are stored in nucleic acid molecules. The synthesized nucleic acid molecules carry the information encoded by the succession of the nucleotides forming the nucleic acid molecules. Each of the synthesized nucleic acid molecules consists of a sequence or chain of nucleotides generated by a bio-chemical process and represents an oligo or nucleic acid fragment wherein the sequence or cascade of the nucleotides encodes a code word sequence corresponding to a set of information units, e.g., sets of information bits of user data. For example, in a DNA storage system, short DNA fragments are generated. These molecules can be stored and the information can be retrieved from the stored molecules by reading the sequence of nucleotides using a sequencer.

In this context, the terms "nucleic acid fragment", "oligonucleotide" and "oligo" are used interchangeably and refer to a short nucleic acid strand. The term "short" in this context is to be understood as short in comparison to a length of natural DNA which encodes genetic instructions used by living organisms and which may consist of millions of nucleotides. Synthesized oligos may contain more than one, for example more than hundred, e.g. between 100 and 300, or several thousands of nucleotides.

Oligonucleotide synthesis or nucleic acid synthesis is the chemical synthesis of oligos with a defined chemical structure, i.e., with a defined sequence of nucleotides, which can be generated by a nucleic acid synthesizer. In other words, a synthesizer can be used to generate artificial, synthetic fragments of nucleic acid molecules, for example DNA fragments, i.e. DNA oligos. This technology enables a provision of data storage systems wherein a write process is based on the creation of nucleic acid fragments as sequences of nucleotides which encode information to be stored.

The generated nucleic acid fragments are stored, for example as solid matter or dissolved in a liquid, in a nucleic acid storage container. The characteristics of the nucleic acid storage may depend on the amount of stored data and an expected time before a readout of the data will take place.

Digital information storage in synthesized DNA or RNA may provide a high-capacity, low-maintenance information storage.

DNA storage has been investigated in "Next-generation digital information storage", Church et al., Science 337, 1628, 2012, and in "Towards practical, high-capacity, low-maintenance information storage in synthesized DNA", Goldman et al., Nature, vol. 494, 2013.

In a data storage system, for example a DNA storage system, the synthesized nucleic acid fragments can be stored. The information can be retrieved from the stored nucleic acid fragments by sequencing of the nucleic acid fragments using a sequencer. Sequencing is a process of determining the order of nucleotides within the particular nucleic acid fragment. Sequencing can be interpreted as a read process. The read out order of nucleotides is processed or decoded to recover the original information stored in the nucleic acid fragment. In a nucleic acid storage system the oligos are synthesized, i.e. nucleic acid strands to be stored are created, amplified, i.e., the number of each single oligo is increased, e.g., to several hundreds or thousands, and—after storage—sequenced, i.e., the sequence of nucleotides for each oligo is analyzed.

The data can be any kind of sequential digital source data to be stored, e.g., sequences of binary or quaternary code symbols, corresponding to digitally, for example binary, encoded information, such as textual, image, audio or video data. Due to the limited oligo length, the data is usually distributed to a plurality of oligos.

DNA strands consist of four different nucleotides identified by their respective nucleobases or nitrogenous bases, namely, Adenine, Thymine, Cytosine and Guanine, which are denoted shortly as A, T, C and G, respectively. RNA strands also consist of four different nucleotides identified by their respective nucleobases, namely, Adenine, Uracil, Cytosine and Guanine, which are denoted shortly as A, U, C and G, respectively.

Nucleobases tend to connect to their complementary counterparts via hydrogen bonds. For example, natural DNA usually shows a double helix structure, where A of one strand is connected to T of the other strand, and, similarly, C tends to connect to G. In this context, A and T, as well as C and G, are called complementary. Correspondingly, A with U and G with C form pairs of complementary RNA bases.

Two sequences of nucleotides are considered "reverse complementary" to each other, if an antiparallel alignment of the nucleotide sequences results in the nucleobases at each position being complementary to their counterparts.

Reverse complementarity does not only occur between separate strands of DNA or RNA. It is also possible for a sequence of nucleotides to have internal or self-reverse complementarity. This may result in a folded configuration where the strand or sequence binds to itself and may, for example, form "hairpins" or loops. The self-reverse complimentary areas of one strand may interconnect and form the "hairpins", for example during the amplification process, leading to the effect that the related nucleic acid oligo may completely be missing in the amplification result.

While a single short self-complementary segment may be acceptable, for example, long self-reverse complementary DNA fragments may not be readily sequenced and corresponding DNA strands will possibly not appear in readouts, which prohibits or at least hinders later decoding of the information encoded in the strand.

To avoid the self-complementarity problem, each oligo could be checked after creation on self-reverse complementariness, which requires high computational effort.

Therefore, a specific coding should be used that defines, how the source information (e.g. provided in bytes) is represented by a plurality of nucleotides to avoid synthesis of long reverse complementary nucleotide sequences when storing data in nucleic acid strands.

SUMMARY

There is a need to provide a method and an apparatus for encoding information units in code word sequences which allow synthesis of data storing nucleic acid molecules suitable for reliable retrieval of the stored information units when sequencing the nucleic acid molecules.

According to an aspect of the present principles, a method for encoding (or translating) a plurality of information units in at least one sequence of code words consisting of quaternary code symbols, to be used for storing information in synthesized nucleic acid molecules comprising sequences of nucleotides corresponding to the code words is provided, wherein a plurality of codes is provided, consisting of a same amount of corresponding code words, wherein the code words consist of code symbols representing nucleotides and none of the code words belongs to more than one of said codes and said codes are capable of completely encoding said plurality of information units, wherein the information units are mapped or assigned to corresponding code words; the plurality of information units is encoded using at least one code word sequence generated from said plurality of codes; and wherein generating said at least one code word sequence comprises:

selecting, from the plurality of code words of a code of said plurality of codes, a next code word to be appended to the code word sequence;

appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and otherwise selecting a corresponding next code word from a different code of said plurality of codes and repeating the appending.

The code words comprise or consist of sequences of quaternary code symbols. This allows a direct correspondence or mapping of used symbols to DNA or RNA nucleotides or nucleobases and enables a more efficient coding than, for example, a mapping of binary symbols 0 and 1 to two respective of the four different nucleotides. A code symbol sequence represents a (first) sequence of nucleotides to be synthesized from said code symbol sequence, whereas a reverse complementary code symbol sequence corresponds to another (second) code symbol sequence that represents the reverse complementary nucleotide sequence of the sequence of nucleotides represented by said (first) code symbol sequence.

Accordingly, an apparatus for encoding a plurality of information units in at least one sequence of code words consisting of quaternary code symbols, to be used for storing information in synthesized nucleic acid molecules comprising sequences of nucleotides corresponding to the code words comprises a code generator unit configured to provide a plurality of codes, consisting of a same amount of corresponding code words, wherein the code words consist of code symbols representing nucleotides and none of the code words belongs to more than one of said codes and said codes are capable of completely encoding said plurality of information units, wherein the information units are mapped or assigned to corresponding code words;

an information encoder unit configured to encode the plurality of information units using at least one code word sequence generated from said plurality of codes; and a code word sequence generator unit configured to generate said at least one code word sequence at least by:

selecting, from the plurality of code words of a code of said plurality of codes, a next code word to be appended to the code word sequence;

appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and otherwise selecting a corresponding next code word from a different code of said plurality of codes and repeating the appending.

Further, a computer readable storage medium has stored therein instructions enabling encoding of a plurality of information units in at least one sequence of code words consisting of quaternary code symbols, to be used for storing information in synthesized nucleic acid molecules comprising sequences of nucleotides corresponding to the code words, which, when executed by a computer, cause the computer to:

provide a plurality of codes, consisting of a same amount of corresponding code words, wherein the code words consist of code symbols representing nucleotides and none of the code words belongs to more than one of said codes and said codes are capable of completely encoding said plurality of information units, wherein the information units are mapped or assigned to corresponding code words;

encode the plurality of information units using at least one code word sequence generated from said plurality of codes; and generate said at least one code word sequence at least by:

selecting, from the plurality of code words of a code of said plurality of codes, a next code word to be appended to the code word sequence;

appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and otherwise selecting a corresponding next code word from a different code of said plurality of codes and repeating the appending.

The computer readable storage medium has stored therein instructions which, when executed by a computer, cause the computer to perform steps of the described method, i.e. it tangibly embodies a program of instructions executable by the computer to perform the steps of the described method.

The solution according to the aspect of the present principles provides an encoding scheme for generating code word sequences to be used for synthesizing nucleic acid molecules containing corresponding sequences of nucleotides. The encoding of data or information units is done by concatenating code words from a plurality of suited codes to generate code word sequences to be used for synthesizing oligos. Each time a next code word is to be added to a code word sequence, it is checked if a concatenated sequence consisting of or comprising the already built part of the sequence and the next code word to be appended will contain the reverse complementary code word of any tail part of the sequence that at least partly contains the next code word to be appended, i.e. contains at least one code symbol of the next code word to be appended (or overlaps with the next code word to be appended by at least one code symbol). A defined length of the tail part is provided which may be shorter, equal to or longer than the code word length, i.e. the amount of code symbols a code word consists of. The defined length limits the maximum self-reverse complementary sequence of code symbols within the generated code word sequence and, thereby, limits a length of a self-reverse complementary segment a sequence of nucleotides generated from this code word sequence may contain. In case the length of the code symbol sequence is defined but not its exact location within the concatenated sequence, the maximum amount of possible code symbol sequences to be tested corresponds to the length of the code word to be appended, i.e. the amount of code symbols the code word consists of. Additionally, the code symbol sequence may be explicitly determined, e.g. as the code word to be appended, reducing the amount of required tests to one. If it is possible to find a suitable code word within the available code words of a code, the code word is appended to the sequence and a next code word is processed. If it is not possible to find a suitable code word within the code, the processing goes one step back and tries a different code. The coding scheme is used to arrange information units suitably to be stored in nucleic acid fragments while avoiding an occurrence of long reverse complementary nucleic acid fragments.

The provided solution at least has the effect that the nucleic acid strands or oligos synthesized using the created code word sequences will not be self-reverse complementary and will contain no or only very short reverse complementary sections of code symbol sequences contained in the same code word sequence. For example, the maximum self-reverse complementary sequence of code symbols within the generated code word sequence may be shorter than a limit defined by the defined length of the code symbol sequence containing at least partly the next code word to be appended. Since synthesized nucleic acid segments are now usually not self-reverse complementary, a possibility of an occurrence of hairpins is reduced and the reliability of the sequencing of the oligos is improved, allowing provision of a reliable system for storing information in nucleic acid molecules, for example for archiving purposes. Furthermore, the required computation power is limited.

In one embodiment the code symbol sequence consists of the next code word to be appended and a most recently appended code word, and the at least one section comprises a reverse complementary code symbol sequence of the next code word to be appended being directly adjacent to a reverse complementary code symbol sequence of the most recently appended code word. Here, the defined length is set to the length of the next code word to be appended plus the length of the most recently appended code word which currently constitutes the tail code word of the code word sequence where the next code word may be appended. For code words of equal lengths, this limits the maximum possible self-reverse complementary length of code words within the code word sequence to 3×(code word length)−2. Further, this code symbol sequence consists of that code word and the most recently appended code word, and is the only and, therefore, corresponds to any, sequence that overlaps with the next code word to be appended. A code word is suitable to be appended to the code word sequence if appending the code word does not create a section of consecutive code words such that the already created part of the sequence already contains a section of their consecutive reverse complementary code words. A code word is suited, if self-reverse complementary versions of this code word and the previous code word, i.e. the most recently appended code word, do not occur in the already built sequence. A code word is also suited if self-reverse complementary versions of this code word and the previous code word occur in the already built sequence but the self-reverse complementary version of the new code word is not located next to, e.g. right before, the self-reverse complementary version of the previous code word.

In one embodiment the selecting and appending, i.e. the conditional appending comprising testing whether the described reverse complementarity criterion is met, is repeated to generate the code word sequence, until the code word sequence has at least a predefined length or the information units are completely encoded. A predefined length is provided that defines a target length of a code word sequence, which will at least be reached before another code word sequence will be generated. The conditional appending is recursively repeated until all information has been encoded. As the technically feasible length of a sequence of nucleotides a used synthesizer will be able to create is limited, oligos of a predefined length are created using the code word sequences. Once the created code word sequence has at least the predefined length, a next code word sequence will be generated for encoding remaining information units. This allows encoding of any amount of information in code word sequences by distributing the information over a set of code word sequences. A code word sequence may have exactly the predefined length, if, for example, all code words consist of a same amount of code symbols, or may have a length beyond the predefined length if the plurality of codes contains codes with different code word lengths.

In one embodiment the method comprises synthesizing at least one nucleic acid molecule containing a segment wherein a sequence of nucleotides is arranged to correspond to the at least one code word sequence. A nucleic acid molecule may, for example, be a DNA fragment or an RNA fragment generated by a synthesizer device which receives the generated code word sequences. Each of the synthesized nucleic acid molecules consists of or comprises a sequence or chain of nucleotides generated by a bio-chemical process and represents an oligo or nucleic acid fragment wherein a segment, i.e., the sequence or cascade of at least some of the nucleotides encodes the corresponding code word sequence. For example, in a DNA storage system, short DNA fragments are generated.

Synthesizing of the nucleic acid fragments is performed after generating the code word sequences. In another embodiment the synthesizing is performed during the generation of the at least one code word sequence. In other words, the generation of a code word sequence and its synthesis as a DNA or RNA fragment are not performed in two separate, consecutive steps, but short nucleic acid fragments are generated for the generated code words, and their concatenation to correspond to the code word sequence is performed as a separate step of processing after the code word sequence has been generated. In this context, a code refers to a set of short nucleic acid fragments. This enables a production of short nucleic acid fragments in a first stage even before encoding of the information units into nucleotide sequences, whereas the later encoding comprises a concatenation of the short fragments to longer nucleotide sequences according to the generated code word sequences. This may shorten a duration of the final synthesis, or the synthesis may be accelerated by concurrent usage of more than one synthesizer.

In one embodiment the code symbol sequence consists of or comprises the next code word to be appended and the at least one section comprises the reverse complementary code word of the next code word to be appended. Here, the next code word is appended only if the code word sequence does not contain a section comprising the reverse complementary code word of the next code word. The next code word is not appended if its reverse complementary code word is contained in the already created part of the code word sequence, even if the reverse complementary code word of the most recently appended code word is not contained in the same section. This avoids reverse complementarity even of single code words.

In one embodiment the code symbol sequence consists of or comprises the next code word to be appended and a predefined amount of code words previously appended to the code word sequence and the at least one section comprises reverse complementary code words of the next code word to be appended and of the predefined amount of previously appended code words. For example, the next code word may only be appended if the reverse complementary code word of the most recently appended code word is not adjacent to a reverse complementary code word of a code word preceding the most recently appended code word. In this example a sequence of three consecutive code words is avoided if the already created part of the code word sequence contains a section with their three corresponding reverse complementary code words neighboring each other. Depending on the predefined amount of previously appended code words, even longer reverse complimentary sections may be accepted. A suitable acceptable length may, for example, depend on the structure of the data to be encoded or the amplification factor to be used or the quality of the sequencing process.

In one embodiment, the most recently appended code word is removed and a corresponding code word of a different code of the plurality of codes is selected as the next code word to be appended, if none corresponding code word of the plurality of codes is appendable (i.e. can be appended) as the next code word. In other words, if the next code word cannot be appended and no corresponding next code word of a different code can be appended, either, the last code word is removed although already correctly appended. Instead, if possible, it is replaced by a different corresponding code word taken from a different code of the plurality of codes, i.e. the processing goes one step back and tries a corresponding code word of a different of the codes.

In one embodiment an additional code is provided, consisting of less code words than said plurality of codes, wherein none of the code words of the additional code belongs to any of the plurality of codes, the code words of the additional code have corresponding code words in said plurality of codes and the additional code is capable of incompletely encoding said plurality of information units. The code words of the additional code have corresponding code words in each of the plurality of codes but not each of the code words in any of the plurality of codes has a corresponding code word in the additional code. The additional code is an incomplete code capable of encoding a part, i.e. some, of the information units. It may, for example, be additionally generated when generating the plurality of (complete) codes as non-overlapping subsets of an initial plurality of different code words. In this manner, the overall coding efficiency may be further increased.

In one embodiment the next code word is appended if the concatenation of the code word sequence and the next code word to be appended contains said at least one section, which may for example be a section where a reverse complementary code word of the next code word is directly adjacent to a reverse complementary code word of a most recently appended code word, and a distance between a location of the most recently appended code word and any location of said at least one section within said code word sequence is greater than a predefined distance. The term "distance" refers to a number of code symbols between the most recent code word and the reverse complementary section within the code word sequence. The distance may be a parameter of a probability of self-reverse complementarity problems when sequencing corresponding synthesized nucleic acid fragments and, therefore, of the acceptability of a reverse complementary section within the code word sequence.

In one embodiment the plurality of codes is generated from an initial plurality of code words having all code words containing a runlength of identical code symbols of more than a maximum runlength, either within a single code word or concatenated with another code word of the initial plurality of code words, removed. A code word consists of a sequence of code symbols. A runlength is a sequence of consecutive identical code symbols. The initial plurality of code words contains all code words of all the codes, wherein any code word containing at least one code symbol more in a row than an allowed maximum amount of identical code symbols is omitted. Further, any code word which generates such a runlength of code symbols, when concatenated with another of the code words, is also omitted. This increases suitability of the generated code word sequence for synthesizing a corresponding nucleic acid fragment, as experimental results have shown that longer runlengths in synthesized oligos or nucleic acid fragments can be less suitable for correct sequencing. For example, the maximum runlength is 3, as experiments have shown that the runlength of identical nucleotides within one corresponding oligo should be arranged, for example, not to exceed three.

While not explicitly described, the present embodiments may be employed in any combination or sub-combination.

DETAILED DESCRIPTION OF EMBODIMENTS

For a better understanding, the present principles will now be explained in more detail in the following description with reference to the drawings. It is understood that the present principles are not limited to these exemplary embodiments and that specified features can also expediently be combined and/or modified without departing from the scope of the present principles as defined in the appended claims.

Figure 1:
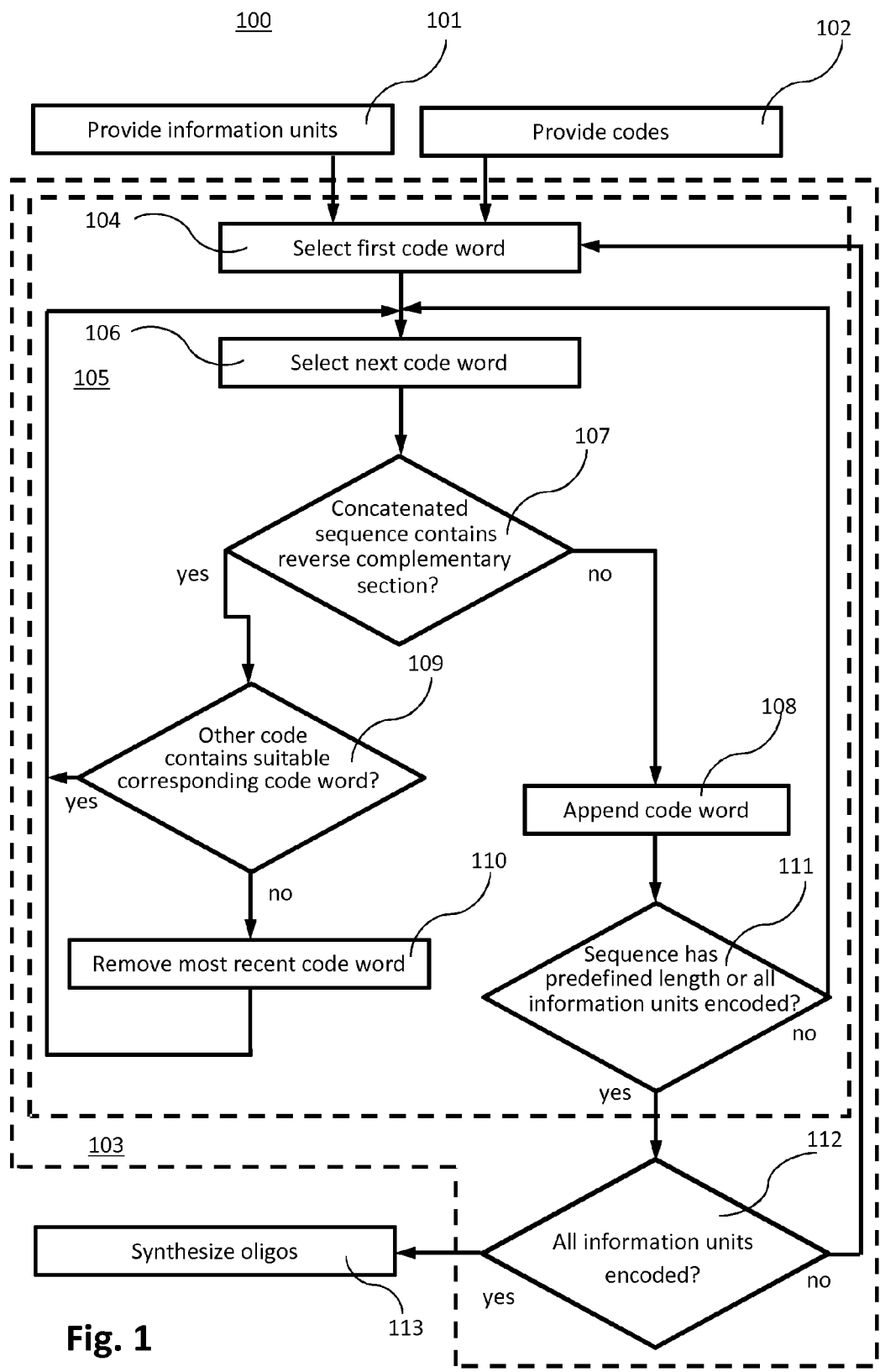
FIG. 1 schematically illustrates an embodiment of a method for encoding a plurality of information units in at least one sequence of code words consisting of quaternary code symbols, to be used for storing information in synthesized nucleic acid molecules comprising sequences of nucleotides corresponding to the code words.

Referring to FIG. 1, an embodiment of a method 100 for encoding a plurality of information units in at least one sequence of code words consisting of quaternary code symbols, to be used for storing information in synthesized nucleic acid molecules comprising sequences of nucleotides corresponding to the code words, is schematically shown. The term "information unit" refers a quantum of information such as a bit or a plurality of bits, for example a byte, and information units may refer to any digital representation of user data to be stored, e.g. binary encoded bitstreams.

A plurality of information units is provided 101. Further, a plurality of codes is provided 102, each consisting of a same amount of corresponding code words. The term "corresponding code words" refers to code words of different codes of the plurality of codes capable of encoding the same information units. None of the code words belongs to more than one of the codes and each of the codes is capable of completely encoding the plurality of information units, wherein the information units are mapped or assigned to the code words. Each of the codes is complete, i.e. each of said information units can be mapped or assigned to a code word of the same code.

The plurality of information units is encoded 103 using at least one code word sequence generated from the plurality of codes. The amount of required code word sequences depends on the amount of information units to be encoded and a length suitable for being used when generating an oligo carrying the encoded information. At least one code word sequence is generated. However, many more may be required for encoding user data, for example an audio or video file.

For each new code word sequence a first code word is selected 104 from the plurality of code words of a code of the plurality of codes.

The generation 105 of each code word sequence further comprises a set of steps which may be executed recursively:

In one step, a next code word to be appended to the code word sequence is selected 106 from the plurality of code words of a code of said plurality of codes. The code may or may not be the same code as the code the first code word was selected from.

In a next step, it is analyzed 107, whether a concatenated sequence, i.e. a concatenation of the code word sequence and the next code word to be appended, contains at least one section that comprises a reverse complementary code symbol sequence of any code symbol sequence of a predefined length that at least partly contains the next code word to be appended, wherein the reverse complementary code symbol sequence corresponds to the reverse complementary of a sequence of nucleotides that is represented by the code symbol sequence.

In any example, the next code word is appended 108 if the code word sequence does not contain such a section.

A section is a sequence of code symbols. It can but does not have to be code word aligned. If the section does not fulfill the described criterion, for example contains the reverse complementary of the most recently appended code word neighboring the reverse complementary of the next code word which has not yet been appended, the next code word is not appended to avoid generation of a long self-reverse complementary portion within the code word sequence being generated.

The two reverse complementary code words being "adjacent" to each other comprises that one reverse complementary code word follows the other, or vice versa. That is, "adjacent" refers to before or after. It could be the sequence of two reverse complementary code words, or the reverse complementary of a sequence of the two code words. Further, in the analysis 107 more than one such section could be detected.

Otherwise 109 a corresponding next code word is selected from a different code of said plurality of codes and the appending, i.e. the analysis 107 of the code word sequence and, depending on the result of the analysis, potentially the actual appending 108 of the next code word, is repeated.

If none corresponding code word of the plurality of codes is appendable (i.e. can be appended) as the next code word to the most recently appended code word, the most recent code word, i.e. the most recently appended code word, is removed 110 and a corresponding code word of a different code of the plurality of codes is selected as the next code word.

The selecting and appending is repeated to generate the current code word sequence, until the code word sequence has at least a predefined length or the information units are completely encoded 111.

If the code word sequence has the predefined length but remaining information units still have to be encoded 112, another code word sequence is generated.

In the shown embodiment a nucleic acid molecule is synthesized 113 using the generated code word sequence. The nucleic acid molecule contains a segment wherein a sequence of nucleotides is arranged to correspond to the code word sequence. Many more than one nucleic acid molecules may be generated. The amount of nucleic acid molecules or oligos generated or synthesized by a synthesizer corresponds to the amount of generated code word sequences. At least one nucleic acid molecule is synthesized for each code word sequence. However, multiple nucleic acid molecules may be generated for each or a selected, for example high-priority, subset of the code word sequences. The synthesizing step may be carried out after generation of all code word sequences or after generation of each of the sequences.

The synthesized nucleic acid molecules carry the information encoded by the succession of the nucleotides forming the nucleic acid molecules. These molecules can be stored and the information can be retrieved by reading the sequence of nucleotides using a sequencer and decoding the extracted code words.

Figure 2:
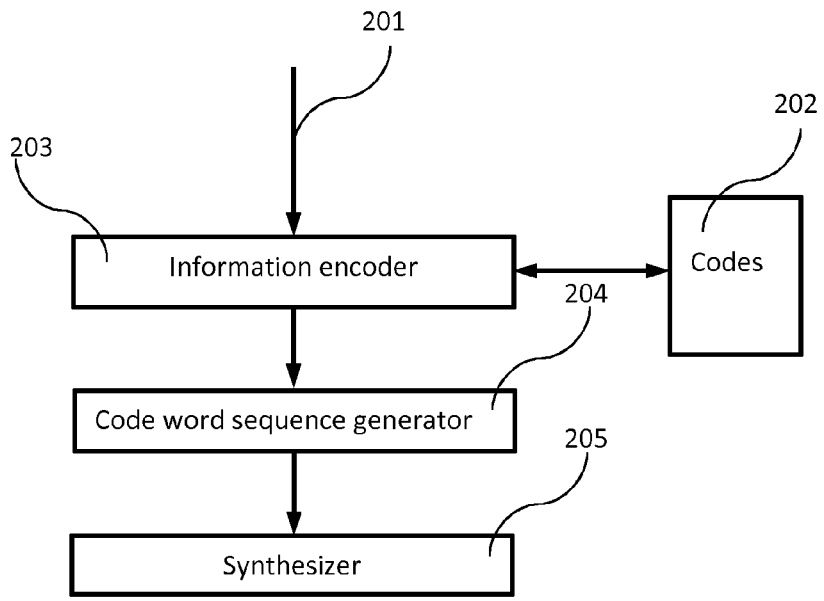
FIG. 2 schematically illustrates an embodiment of an apparatus for encoding a plurality of information units in at least one sequence of code words consisting of quaternary code symbols, to be used for storing information in synthesized nucleic acid molecules comprising sequences of nucleotides corresponding to the code words.

Referring to FIG. 2, an embodiment of an apparatus 200 for encoding (or translating or mapping) a plurality of information units in at least one sequence of code words consisting of quaternary code symbols, to be used for storing information in synthesized nucleic acid molecules comprising sequences of nucleotides corresponding to the code words is schematically illustrated. The shown apparatus allows implementing the advantages and characteristics of the described method as part of an apparatus for encoding a plurality of information units in at least one sequence of code words consisting of quaternary code symbols, to be used for storing information in synthesized nucleic acid molecules comprising sequences of nucleotides corresponding to the code words.

The apparatus 200 has an input 201 for receiving information units to be encoded and providing them to an information encoder unit 203. The apparatus 200 further comprises a code generator unit 202 configured to provide a plurality of codes, consisting of a same amount of corresponding code words, wherein none of the code words belongs to more than one of the codes and the codes are capable of completely encoding the plurality of information units. The code generator unit 202 may, for example, be programmable logic circuitry or a processing device arranged to generate the multiple codes, connected to a memory device for storing the codes. The code words may be generated on request by the information encoder unit 202 or may be generated in advance and provided via, for example, a code book table or memory containing the generated code words. Therefore, the code generator unit 202 may also refer to a set of code books provided in one or more memory devices.

The information encoder unit 203 is configured to encode the plurality of information units using at least one code word sequence generated from the plurality of codes.

Further, the apparatus 200 comprises a code word sequence generator unit 204 connected to the information encoder unit 203 and configured to generate each of the at least one code word sequence at least by: selecting, from the plurality of code words of a code of the plurality of codes, a next code word to be appended to the code word sequence;

appending the next code word if a concatenation of the code word sequence and the next code word does not contain a section comprising a reverse complementary code symbol sequence of any code symbol sequence of a defined length that at least partly contains the next code word to be appended; and otherwise selecting a corresponding next code word from a different code of the plurality of codes and repeating the appending.

The code generator unit 202, the information encoder unit 203 and the code word sequence generator unit 204 may, for example, be provided as separate devices, jointly as at least one device or logic circuitry, or functionality carried out by a microprocessor, microcontroller or other processing device, computer or other programmable apparatus.

In the embodiment shown in FIG. 2, the illustrated apparatus 200 further comprises a synthesizer unit 205 connected to receive the generated code word sequences. It is configured to synthesize nucleic acid molecules, for example DNA or RNA strands, each containing a segment wherein a sequence of nucleotides is arranged to correspond to a particular code word sequence. In another embodiment, the apparatus does not comprise the synthesizer unit but is connected or connectable to it by means of an interface.

For storing digital data in a nucleic acid strand, such as a DNA strand, a code is generated by the code word generator unit 202. The code assigns to each digital source value or information unit a specific sequence of code symbols. Each code symbol may later be translated into a corresponding nucleotide of the nucleic acid strand. For example, when using bytes as source values, i.e. information units, the code is chosen to define the assignment of 256 numbers to different sequences of code symbols, i.e. different code words. Each code word will be translated or transformed into a corresponding nucleotide sequence. Other input values may be used.

Figure 3:
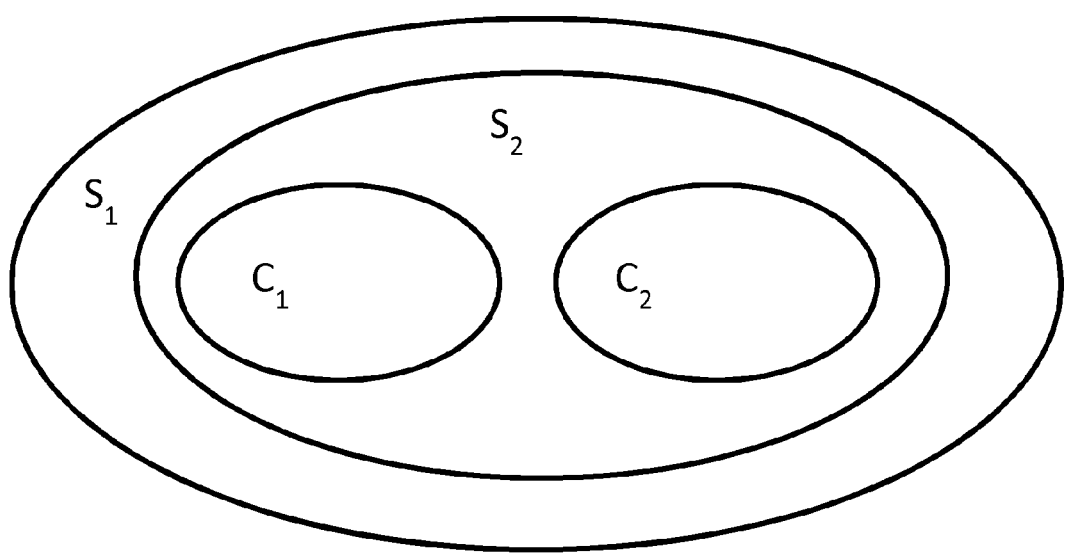
FIG. 3 schematically illustrates an example of a division of an initial plurality of code words into a plurality of codes.

In order to explain in more detail the code generation performed by the code generator unit 202, an example of a division of an initial plurality of code words into a plurality of codes is schematically illustrated in FIG. 3.

A succession of n nucleotides can hold $n^4$ different sequences of nucleotides (e.g. n=4: 256, n=5: 1024, n=6: 4096). As shown, a corresponding set $S_1$ of code words, i.e. different sequences of code symbols, has all items or code words removed, which might otherwise lead to runlength problems when concatenating the code words to form a code word sequence.

Therefore, all code words containing a runlength greater than three are removed. Further, all code words which might lead to runlength problems when being concatenated are removed. A possible rule applied by the code word generator unit 202 for avoiding concatenation problems is to allow only a maximum of two identical code symbols, respectively nucleotides, at the beginning of an item or code word and no two identical nucleotides at the end of an item or code word. Other rules may be applied instead. With the rule described above, the set $S_1$ (for example, 1024 different code symbol sequences or code words for n=5) is reduced to a subset $S_2$, for example containing 720 code words if $S_1$ has a size of 1024). Code words of the subset $S_2$ can be chosen to form a code. If, for example, a code with 256 code values is required, the code generator unit 202 generates two codes ($C_1$ and $C_2$) each forming a subset of $S_2$. The generated codes are complete, as their number of code words is identical to the number of source values or information units. Further, as their intersection is empty, for each source value any of the available codes $C_1$ and $C_2$ can be used during the encoding process.

Figure 4:
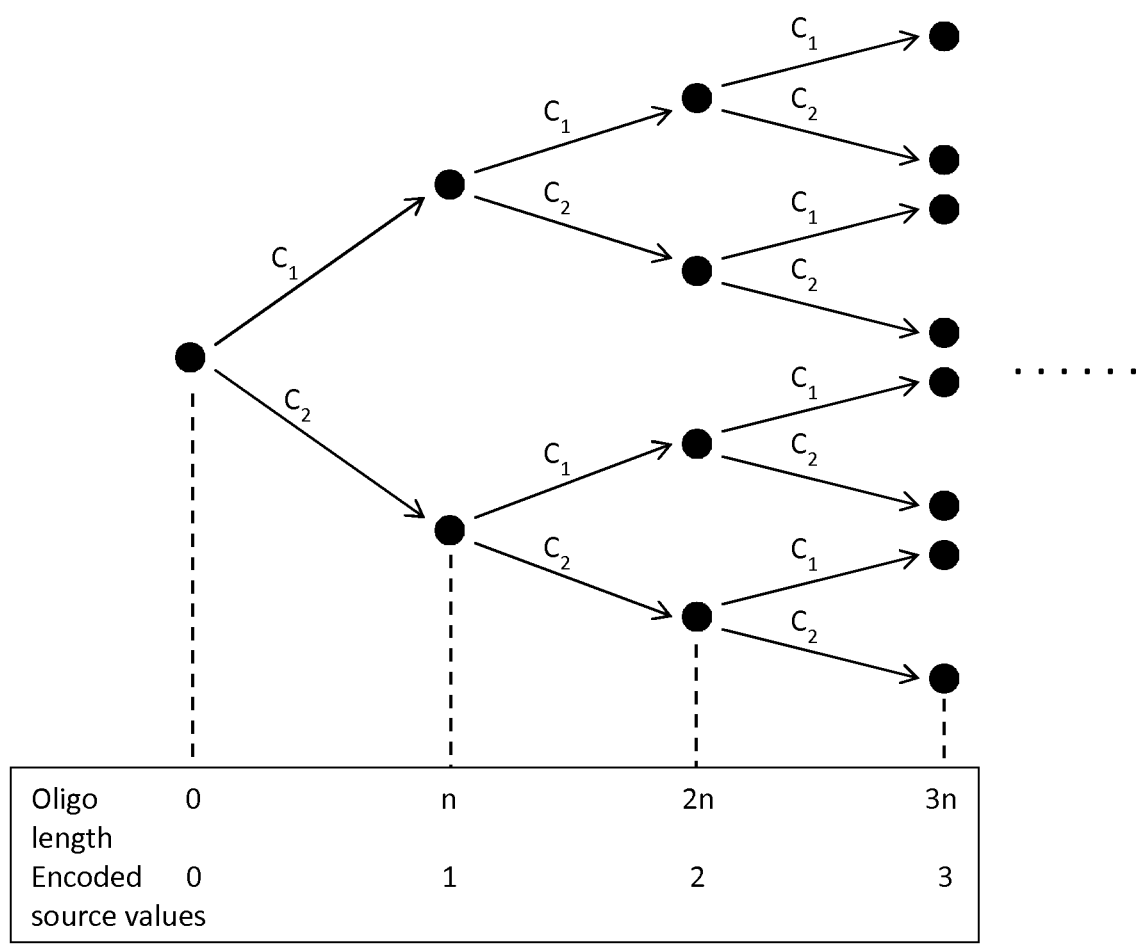
FIG. 4 schematically illustrates an example of a decision tree which code to use for which code word in a code word sequence.

Additionally referring to FIG. 4, an example of a decision tree which code to use for which code word in a code word sequence is schematically shown. A way of selecting the right code for each source value or information unit such that self-reverse complementariness is avoided is described. A code word sequence for an oligo is generated such that it consists of a sequence of m code words, each consisting of n code symbols which correspond to n nucleotides or nucleobases when synthesizing a corresponding oligo.

The decision tree shown in FIG. 4 visualizes which of two available codes $C_1$ and $C_2$ can be chosen when generating the code word sequence. In case of the two available codes $C_1$ and $C_2$, the possible number of code combinations, which corresponds to the number of paths from left to right, for the m code words is $2^m$.

The solution according to the present principles allows determining, if a path represents a code word sequence, respectively an oligo, with no self-reverse complementary sections. The number of paths describing oligos without self-reverse complementary sections is usually much larger than the number of paths with self-reverse complementary sections.

For example, when the ith code word ($cw_i$) shall be appended to the already created code word sequence containing the code words $cw_0$ to all locations ($L_i$) are determined where the self-reverse complementary version of the code word can be found in a concatenated sequence consisting of the already created code word sequence and the ith code word to be appended. These locations are compared with the locations $L_{i+1}$ within the same concatenated sequence but found for the code word before ($cw_{i+1}$). If the difference between any location in and $L_{i+1}$ is identical to n, appending the code word $cw_i$ would lead to two self-reverse complementary regions or sections potentially having a length of up to 3n−2 code symbols (as there may probably be self-reverse complementary code word fragments of length n−1 neighboring a self-reverse complementary code word of length n code symbols) and is avoided.

A path in the tree where the selected codes fulfill the condition that no two self-reverse complimentary sections exist having the length 2n or above can be found in the following way: Each time a code word ($cw_i$) is to be appended to the already created part of a code word sequence, respectively oligo part, it is checked for the first code $C_1$ in the way described above, if appending of the code word is allowed. If it is not allowed, all other available codes are tried, i.e. $C_2$ in the shown example, until a code word $cw_i$ is found, where the appending is allowed. Then the related code word, respectively code, is selected and the processing is continued with code word $cw_{i+1}$.

If for none of the codes $C_1$ and $C_2$ a code word fulfilling the related condition is found, the process is continued at code word $cw_{i+1}$ again by trying the next available code there. The process is finished, when all m code words were chosen fulfilling the condition described above.

In the example, the codes $C_1$ and $C_2$ were taken from the set $S_2$ shown in FIG. 3. Referring again to FIG. 3, if the number of code words in the set $S_2$ cannot be distributed completely to different codes (in the described example: 720−2×256=208) code words remain unassigned. The unassigned code words can be used to form an incomplete code.

The described solution allows generating code word sequences which can be synthesized as nucleic acid strands which do not contain long self-reverse complementary sections. Self-reverse nucleic acid strands can be avoided and problems with sequencing synthesized nucleic acid strands can be reduced, thereby improving their suitability to serve as a bio-chemical storage for any kind of user data.

As will be appreciated by one skilled in the art, aspects of the present principles can be embodied as an apparatus, a system, method or computer readable medium. Accordingly, aspects of the present principles can take the form of a hardware embodiment, a software embodiment or an embodiment combining software and hardware aspects. Furthermore, aspects of the present principles can take the form of a computer readable storage medium. Any combination of one or more computer readable storage medium(s) may be utilized.

Aspects of the present principles may, for example, at least partly be implemented in a computer program comprising code portions for performing steps of the method according to an embodiment of the present principles when run on a programmable apparatus or enabling a programmable apparatus to perform functions of an apparatus or system according to an embodiment of the present principles.

Further, any shown connection may be a direct or an indirect connection. Furthermore, those skilled in the art will recognize that the boundaries between logic blocks are merely illustrative and that alternative embodiments may merge logic blocks or impose an alternate decomposition of functionality upon various logic blocks.

The invention claimed is:

1. A computer-implemented method for encoding a plurality of information units in at least one sequence of code words consisting of quaternary code symbols, to be used for storing information in synthesized nucleic acid molecules comprising sequences of nucleotides corresponding to the code words, comprising
   providing a plurality of codes, consisting of a same amount of corresponding code words, wherein the code words consist of code symbols representing nucleotides and none of the code words belongs to more than one of said codes and each of said codes is capable of completely encoding said plurality of information units, wherein the information units are mapped to corresponding code words;
   encoding the plurality of information units using at least one code word sequence generated from said plurality of codes during a generating process comprising:
      selecting, from the plurality of code words of a code of said plurality of codes, a next code word to be appended to the code word sequence; appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and
      otherwise selecting a corresponding next code word from a different code of said plurality of codes and repeating the appending.

2. The method according to claim 1, wherein the code symbol sequence consists of the next code word to be appended and a most recently appended code word, and the at least one section comprises a reverse complementary code symbol sequence of the next code word to be appended being directly adjacent to a reverse complementary code symbol sequence of the most recently appended code word.

3. The method according to claim 1, wherein the selecting and appending is repeated to generate the code word sequence, until the code word sequence has at least a predefined length or the information units are completely encoded.

4. The method (100) according to claim 1, comprising
   synthesizing at least one nucleic acid molecule containing a segment wherein a sequence of nucleotides is arranged to correspond to the at least one code word sequence.

5. The method according to claim 4, wherein the synthesizing is performed during the generation of the at least one code word sequence.

6. The method according to claim 1, wherein said code symbol sequence consists of the next code word to be appended and the at least one section comprises the reverse complementary code word of the next code word to be appended.

7. The method according to claim 1, wherein said code symbol sequence consists of the next code word to be appended and a predefined amount of code words previously appended to the code word sequence and said at least one section comprises reverse complementary code words of the next code word to be appended and of the predefined amount of previously appended code words.

8. The method according to claim 1, wherein, if none corresponding code word of the plurality of codes is appendable as the next code word, the most recently appended code word is removed and a corresponding code word of a different code of the plurality of codes is selected as the next code word to be appended.

9. The method according to claim 1, wherein an additional code is provided, consisting of less code words than said plurality of codes, wherein none of the code words of the additional code belongs to any of the plurality of codes, the code words of the additional code have corresponding code words in said plurality of codes and the additional code is capable of incompletely encoding said plurality of information units.

10. The method according to claim 1, wherein the next code word is appended if the concatenation of the code word sequence and the next code word to be appended contains said at least one section and a distance between a location of the most recently appended code word and any location of said at least one section within said code word sequence is greater than a predefined distance.

11. The method according to claim 1, wherein the plurality of codes is generated from an initial plurality of code words having all code words containing a runlength of identical code symbols of more than a maximum runlength, either within a single code word or concatenated with another code word of the initial plurality of code words, removed.

12. An apparatus for encoding a plurality of information units in at least one sequence of code words consisting of quaternary code symbols, to be used for storing information in synthesized nucleic acid molecules comprising sequences of nucleotides corresponding to the code words, comprising
a code generator unit configured to provide a plurality of codes, consisting of a same amount of corresponding code words, wherein the code words consist of code symbols representing nucleotides and none of the code words belongs to more than one of said codes and each of said codes is capable of completely encoding said plurality of information units, wherein the information units are mapped to corresponding code words;
an information encoder unit configured to encode the plurality of information units using at least one code word sequence generated from said plurality of codes; and
a code word sequence generator unit configured to generate said at least one code word sequence at least by:
selecting, from the plurality of code words of a code of said plurality of codes, a next code word to be appended to the code word sequence;
appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and
otherwise selecting a corresponding next code word from a different code of said plurality of codes and repeating the appending.

13. The apparatus according to claim 12, comprising a synthesizer unit configured to synthesize at least one nucleic acid molecule containing a segment wherein a sequence of nucleotides is arranged to correspond to the at least one code word sequence.

14. A non-transitory computer readable storage medium having stored therein instructions enabling encoding of a plurality of information units in at least one sequence of code words consisting of quaternary code symbols, to be used for storing information in synthesized nucleic acid molecules comprising sequences of nucleotides corresponding to the code words, which, when executed by a computer, cause the computer to:
provide a plurality of codes, consisting of a same amount of corresponding code words, wherein the code words consist of code symbols representing nucleotides and none of the code words belongs to more than one of said codes and each of said codes is capable of completely encoding said plurality of information units, wherein the information units are mapped to corresponding code words;
encode the plurality of information units using at least one code word sequence generated from said plurality of codes; and
generate said at least one code word sequence at least by:
selecting, from the plurality of code words of a code of said plurality of codes, a next code word to be appended to the code word sequence;
appending the next code word if a concatenation of the code word sequence and the next code word to be appended does not contain at least one section comprising a reverse complementary code symbol sequence of any code symbol sequence of a defined length that at least partly contains the next code word to be appended, wherein the reverse complementary code symbol sequence corresponds to the reverse complementary of a sequence of nucleotides that is represented by the code symbol sequence; and
otherwise selecting a corresponding next code word from a different code of said plurality of codes and repeating the appending.

15. An apparatus for decoding at least one sequence of code words obtained by the method of claim 1.

* * * * *